United States Patent
Verlinden et al.

(12) 
(10) Patent No.: US 6,287,674 B1
(45) Date of Patent: Sep. 11, 2001

(54) LAMINATE COMPRISING A THIN BOROSILICATE GLASS SUBSTRATE AS A CONSTITUTING LAYER

(75) Inventors: Bart Verlinden, Tongeren; Jean-Pierre Tahon, Leuven; Leo Vermeulen, Herenthout; Luc Leenders, Herentals, all of (BE)

(73) Assignee: Agfa-Gevaert, Mortsel (BE)

( * ) Notice: Subject to any disclaimer, the term of this patent is extended or adjusted under 35 U.S.C. 154(b) by 0 days.

(21) Appl. No.: 09/152,682

(22) Filed: Sep. 14, 1998

Related U.S. Application Data

(60) Provisional application No. 60/069,419, filed on Dec. 18, 1997, and provisional application No. 60/078,283, filed on Mar. 17, 1998.

(30) Foreign Application Priority Data

Oct. 24, 1997 (EP) .................................................. 97203312

(51) Int. Cl.$^7$ .............................. B32B 17/06; B32B 31/04
(52) U.S. Cl. ..................... 428/210; 428/195; 428/201; 428/203; 428/209; 428/332; 428/412; 428/426; 428/430; 428/432; 428/441; 428/458; 428/461; 428/480
(58) Field of Search .................................... 428/195, 201, 428/203, 210, 209, 332, 337, 412, 426, 430, 432, 441, 480, 458, 461; 156/297

(56) References Cited

U.S. PATENT DOCUMENTS

| 3,708,386 | 1/1973 | Alexander et al. . | |
|---|---|---|---|
| 3,850,640 | 11/1974 | Babbitt et al. . | |
| 4,870,034 | * 9/1989 | Kiefer | 501/66 |
| 5,324,374 | * 6/1994 | Harmand et al. | 156/102 |
| 5,543,273 | 8/1996 | Smith et al. . | |
| 5,547,904 | * 8/1996 | Watzke et al. | 501/66 |
| 5,589,272 | 12/1996 | Braun et al. . | |

FOREIGN PATENT DOCUMENTS

| 0 716 339 A1 | 6/1996 | (EP) . |
|---|---|---|
| 1 217 169 | 12/1970 | (GB) . |

* cited by examiner

*Primary Examiner*—Vivian Chen
(74) *Attorney, Agent, or Firm*—Breiner & Breiner, L.L.C.

(57) ABSTRACT

A flexible laminate is disclosed wherein a thin borosilicate glass substrate is bonded to a support, which is preferably a transparent plastic support. The glass substrate protects the support from scratches, moisture, solvents and gases, and improves the dimensional and thermal stability of the support, whereas the support protects the glass from breakage. The use of borosilicate significantly reduces the chance of breakage compared to e.g. sodium or chemically hardened glass. The laminate can be used for carrying a functional layer such as an image recording layer. The laminate is especially suitable for carrying color filters and electroconductive layers in flat panel displays.

20 Claims, No Drawings

LAMINATE COMPRISING A THIN BOROSILICATE GLASS SUBSTRATE AS A CONSTITUTING LAYER

This application claims benefit of U.S. Provisional Applications Serial No. 60/069,419, filed Dec. 18, 1997 and Ser. No. 60/078,283, filed Mar. 17, 1998.

FIELD OF THE INVENTION

The present invention is related to a laminate comprising a thin borosilicate glass and a support, and to materials wherein said laminate carries a functional layer, such as an image recording layer and especially an electroconductive or a colour-filter layer for use in flat panel displays.

BACKGROUND OF THE INVENTION

Plastic materials are widely used as support for carrying a functional layer such as an image recording layer, an electro-conductive layer, a light modulating layer, an adhesive layer, etc. Many applications require the use of a dimensionally stable support for carrying such a functional layer. Known examples thereof are graphic-arts applications and photomasks for the manufacture of printed circuit boards. In these applications glass plates are often used as a support because glass is characterised by excellent dimensional stability in varying conditions of temperature or humidity, contrary to a plastic support.

Another example of an application which requires high thermal and dimensional stability is the manufacturing of flat panel displays such as liquid crystal displays (LCDs), wherein glass plates are used as support for carrying a plurality of functional layers such as colour filters, electro-conductive layers and liquid crystal orientation layers. Glass plates used in flat panel displays such as LCDs have a typical thickness in the range from 0.7 to 1.1 mm. At least two such glass plates are needed in each display and the weight of a display is mainly determined by the size and thickness of these glass plates. In "Fourth-Generation LCDs—EIAJ Display Forecast", published in "Display Devices", Spring '96, Serial no. 13, p.14–19 (published by Dempa Publications Inc., Tokyo), it is emphasised that weight reduction of flat panel displays is an important need in the art, especially when such displays are to be incorporated in mobile applications such as portable computers. A further reduction of the thickness of the glass plates is however limited due to the high brittleness of such thin glass.

In addition to a high thermal and dimensional stability, glass has many other beneficial properties compared to plastic materials, e.g. the ease of recycling, excellent hardness and scratch resistance, high transparency, good resistance to chemicals such as organic solvents or reactive agents, low permeability of moisture and gases, and a very high glass transition temperature, enabling the use of high-temperature processes for applying a functional layer. However, the main problems associated with the use of glass as support for applying a functional layer are the low flexibility, the high specific weight and the high risk of glass breakage, especially when thin glass is used. Due to the low flexibility of glass, the coating of a functional layer on glass is typically carried out in a batch process (sheet by sheet), whereas the coating of a plastic support is generally performed as a continuous process, e.g. using a web or roll coater. It is self-evident that the productivity and cost efficiency of a continuous (web) coating process is significantly higher than of a batch (sheet) coating process.

EP-A 716 339 describes a process using a flexible glass web, which can be wound up around a core so as to obtain a roll of glass. Said glass can be unrolled and coated with a functional layer in a continuous web coating method. Said flexible glass is characterised by (i) a thickness lower than 1.2 mm, (ii) a failure stress (under tensile stress) equal to or higher than $1 \times 10^7$ Pa and (iii) an elasticity modulus (Young's modulus) equal to or lower than $1 \times 10^{11}$ Pa. Glass according to these specifications is indeed flexible and can be wound around a core. However, the probability of web breakage is high because a sharp local pressure applied on the surface of the glass web is sufficient to break the glass. Even the smallest probability of web breakage during coating is to be eliminated when carried out on an industrial scale, since the advantages associated with a continuous web coating process are then lost due to the interruption of the process.

The above problem is also recognised in WO 87/06626, wherein it is stated that thin glass having a thickness of 1 to 15 mils breaks almost immediately when rolled up. As a solution to protect a glass web which is wound around a core, WO 87/06626 describes the use of an interleave which prevents glass-to-glass contact. Said interleave is a non-abrasive material such as an embossed polyester film. However, when the glass web is unwound from its core, the interleave is separated from the glass and from then on, the same problems arise as discussed above with regard to EP-A 716 339.

In order to combine the advantageous properties of different materials it is known to adhere sheets of said different materials to each other so as to obtain a laminate. A well known example is security glass used in car windshields as described in FR 2.138.021 and EP-A 669 205. The latter patent application describes a glass/plastic laminate comprising a glass pane, an intermediate adhesive layer and a plastic pane, wherein the glass has a thickness from 30 to 1000 $\mu$m. The glass is preferably a chemically hardened glass and before lamination, a functional layer can be applied to the glass. After lamination, said functional layer is sandwiched between the glass and the plastic layer and is thereby protected from outside influences. A laminate of a thin chemically hardened glass and a plastic support has also been described in U.S. Pat. No. 3,471,356. However, thin chemically hardened glass is not sufficiently strong to reduce the risk of glass breakage adequately.

SUMMARY OF THE INVENTION

It is an object of the present invention to provide an improved glass-laminate which is characterised by the known advantages of glass, i.e. high dimensional and thermal stability, excellent hardness and scratch resistance, good resistance to chemicals such as organic solvents or reactive agents, and low permeability of moisture and gases. It is a particular object of the present invention to provide a material which, in addition to the above advantageous properties, has a low specific weight and which preferably enables the use of a continuous web or roll coating method for applying a functional layer, i.e. a material which is characterised by a sufficient flexibility and which does not easily break. These objects are realised by the laminate defined in the claims.

It is another object of the present invention to provide a material wherein said laminate is used for carrying a functional layer.

It is still another object of the present invention to provide a method for making said laminate carrying a functional layer using a web coating apparatus.

Further advantages and embodiments of the present invention will be discussed in the detailed description.

DETAILED DESCRIPTION OF THE INVENTION

The laminate of the present invention comprises a thin borosilicate glass substrate and a support. The term "laminate" as used herein shall be understood as "a material consisting of a plurality of bonded layers". The glass layer and the support layer may be bonded to each other by applying an intermediate adhesive layer between said bonded layers but also vacuum lamination can be used as will be discussed below. The term "support" is used in the meaning of a "self-supporting layer" so as to distinguish it from layers which may be coated on a support but which are not self-supporting.

The glass substrate protects the support from scratches, moisture, solvents and gases, and improves the dimensional and thermal stability of the support. The risk of breakage of the glass substrate is lower, not only because the support protects the glass from breakage, but also because borosilicate glass is significantly stronger than regular sodium glass or even chemically strengthened glass, as will be shown in detail below.

The dimensional stability of the laminate of the present invention depends on the relative thickness of the glass substrate and the support and the elasticity of both these materials. Glass is known to have a much higher dimensional stability than e.g. a plastic support such as poly(ethylene terephtalate). A laminate consisting of such a plastic support and a glass substrate has a dimensional stability which is significantly improved when compared to the plastic support as such and the higher the relative thickness of the glass compared to the support, the better the dimensional stability obtained.

The laminate of the present invention is preferably a flexible material. The feature "flexible" as used herein means that the material is capable of being wound around a core. A preferred laminate of the present invention is capable of being wound around a cylindrical core having a radius of 1.5 m without breaking. The lower the thickness of the glass, the higher is its flexibility and thus the lower the minimum radius of the core around which the material can be wound without breaking. However, the brittleness of the glass is inversely proportional to the thickness of the glass and the best compromise between flexibility and brittleness depends on the application. The borosilicate glass used in the present invention has a thickness in the range from 10 to 450 $\mu$m. For some applications, a thickness lower than 300 $\mu$m or even lower than 200 $\mu$m may be preferred. For lower brittleness a thickness of not less than 30 $\mu$m or even not less than 50 $\mu$m may be preferred.

A flexible laminate according to the present invention can be used in a web coating method for applying a functional layer. Since the glass substrate and the support are bonded layers, the laminate of the present invention is to be distinguished from a stack of non-bonded layers such as the glass/interleave/glass described in WO 87/06626 discussed above. Even if the glass substrate, which is present in the laminate of the present invention, would break due to a sharp local pressure on its surface, the glass fragments remain fixed to the support. In addition, the support prevents breakage of the web as a whole and the coating process is not interrupted. As a result, a flexible laminate according to the present invention enables industrial roll-to-roll manufacturing of e.g. flat panel displays, thereby significantly reducing the costs of the process.

In addition to the above advantages, the laminate of the present invention combines the beneficial properties of a glass surface with an overall low weight, which is especially advantageous when the laminate is used as an alternative for glass in portable devices.

Thin borosilicate glass is commercially available from Deutsche Spezialglass AG (Desag, Germany), a Schott Group company, e.g. types AF45 and D263 with a thickness ranging from 30 $\mu$m to 1.1 mm. According to the technical brochure "Alkali Free and Low Alkali Thin Glasses", subtitle "AF45 and D263: Thin Glasses for Electronic Applications", published by Desag in 1995, thin borosilicate glass is available in a thickness of 30 $\mu$m, 50 $\mu$m, 70 $\mu$m, 100 $\mu$m, 145 $\mu$m, 175 $\mu$m, 210 $\mu$m, 300 $\mu$m, 400 $\mu$m, 550 $\mu$m, 700 $\mu$m, 900 $\mu$m and 1100 $\mu$m. Borosilicate glass comprises $SiO_2$ and $B_2O_3$. The detailed composition of some borosilicate glass types has been described in e.g. U.S. Pat. No. 4,870,034, 4,554,259 and 5,547,904.

The high strength of borosilicate glass compared to other glass types can be measured by the so-called ring-on-ring method of DIN no. 52300-5 (=EN 1288-5) which uses a gradually increasing displacement of a ring towards a glass sheet which is supported by another ring. During said displacement, a gradually increasing tensile force is applied upon the surface of the glass. The method specified above is not appropriate to characterise thin glass as used in the present invention. However, the inventors of the present patent application have demonstrated by final element analysis that the method can be modified to make it suitable for measuring such thin glass : it was found that the tensile strength $\sigma$ of glass, having a thickness d, may be calculated from the maximum force F(max) that is applied at the moment of glass breakage according to the following formula:

$$\sigma = F(max) \times K/d^2$$

$$\text{with } K = \frac{3(1+\mu)}{2\mu}\left[\ln\frac{r_2}{r_1} + \frac{(1-\mu)(r_2^2 - r_1^2)}{(1+\mu)2r_3^2}\right]$$

wherein $\mu$ is the Poisson coefficient of the glass en $r_1$, $r_2$ and $r_3$ are geometrical parameters of the rings used in the experimental measuring device (respectively 6 mm, 30 mm and 58.8 mm). More details of the used method can be found in the DIN specification referred to above.

32 samples of each glass type in table I were measured using the above modified method and the mean tensile strength $\sigma_m$ and corresponding standard deviation S were calculated. Finally, the quantity ($\sigma_m$–3S) was calculated as a criterion for probability of breakage : materials characterised by ($\sigma_m$–3S)<0 break very easily, whereas materials with ($\sigma_m$–3S)>0 have a low probability of breakage and the more positive the value of ($\sigma_m$–3S) is, the lower the probability of breakage. The borosilicate glass types D263 and AF45, specified above, were compared with sodium glass that has been chemically strengthened during the periods indicated in Table 1. All samples had a square shape of 100×100 mm and a thickness of 70 $\mu$m. The results in Table 1 clearly indicate that borosilicate glass has a far superior strength compared to chemically strengthened glass. Another conclusion that can be made from the data in Table 1, which is quite surprising, is that chemical hardening does not seem to decrease the probability of breakage.

TABLE 1

| | Sodium glass chemically hardened during | | | | | Borosilicate | |
|---|---|---|---|---|---|---|---|
| | 0 min. | 15 min. | 30 min. | 45 min. | 60 min. | D263 | AF45 |
| $\sigma_m - 3S$ (MPa) | −840 | −260 | −760 | −560 | −1180 | +600 (a) | +380 |

(a) the value obtained for D263 is probably too high because the glass came loose from the ring during the measurements; this did not occur for AF45.

A possible explanation will now be given for the inferior results obtained with chemically hardened glass compared to borosilicate glass as indicated above, without however limiting the scope of the invention thereto. Chemical strengthening, also called hardening of glass, is a well known procedure for increasing the strength of glass. Chemically hardened glass is glass wherein at both surface layers the original alkali ions are, at least partially, substituted by alkali ions having a larger radius. In chemically hardened sodium lime silica glass, the sodium ions near the surface of the glass are at least partially substituted by potassium and in chemically hardened lithium lime silica glass, the lithium ions near the surface are at least partially substituted by sodium and/or potassium. More details about chemical strengthening of glass are i.a. given in "Glass Technology", Vol. 6, No. 3, page 90–97, June 1965. Chemical hardening is typically carried out by dipping glass sheets in a tank containing a molten salt such as potassium nitrate. Such hardening conditions are unfavourable for achieving a homogeneous ion exchange at the whole surface of the sheet. Local fluctuations of concentration and temperature and flows caused by convection or by the movement of the sheet itself disturb the homogeneity of the reaction conditions at the boundary layer between the surface of the sheet and the chemical hardening medium. This is a typical problem associated with all chemical reactions between agents in a different state of aggregation. Inhomogeneous hardening results in a low failure stress of the glass, since even a microscopically small area characterised by a low ion exchange degree acts as a "weak spot" where a crack may originate easily upon application of a tensile load on the sheet. Borosilicate glass however is obtained directly from the melt and is therefore characterised by an homogeneous composition throughout the whole volume of the glass.

The support, which according to the present invention is laminated to the borosilicate glass, can be paper or metal and more preferably an organic resin such as cellulose acetate, poly(vinyl acetal), polystyrene, polycarbonate (PC), poly(ethylene terephthalate) (PET), polyethylene, polypropylene, polyethersulphon (PES), polydicyclopentadieen (PDCP) or copolymers thereof, e.g. a copolymer of acrylonitrile, styrene and butadiene. PET, PC, PES and PDCP are highly preferred.

The support has preferably a thickness of less than 500 μm and even more preferably less than 250 μm. When the laminate of the present invention is used in high-temperature processes, it may be beneficial to use a very thin support, e.g. having a thickness ranging from 10 to 50 μm, so as to avoid extensive curl of the material due to different thermal shrinkage or expansion of the glass and the support. When used in image recording materials or flat panel displays, the support is preferably a transparent support. In a preferred embodiment the support as well as the adhesive layer are characterised by substantially the same refractive index as the glass.

Methods for laminating the glass substrate to the support are well known. Both layers may be laminated without the use of an adhesive layer by so-called vacuum lamination. In order to obtain an effective bond between the glass substrate and the support by vacuum lamination, both these materials are preferably characterised by a low surface roughness, e.g. the support preferably does not contain a so-called spacing agent, which is often introduced in plastic foils or in coatings on foils to prevent sticking. In addition to vacuum lamination, the use of double-sided adhesive tape or an adhesive layer, obtained by applying e.g. a hotmelt or a latex followed by the application of heat or pressure, is highly preferred. Said latex is e.g. polyurethane, polyethylene, poly(methyl acrylate) or ethylene-vinyl acetate. Alternatively a slightly moistened gelatine layer can also be used as an adhesive layer.

The adhesive layer may be applied either to the glass substrate, to the support, or to both and may be protected by a stripping layer, which is removed just before lamination. After lamination, the bond between the glass substrate and the support may be permanent or reversible. In the latter case, the glass substrate and the support can again be delaminated from each other.

Lamination of the glass substrate and the support can be effected manually but preferably is effected in a laminating means called a laminator. A typical laminator comprises a pair of heatable rollers, having an adjustable pressure and moving at a fixed or an adjustable speed. The lamination with a laminator is effected by bringing the glass substrate and the support in close contact with each other. An adhesive may be applied between both materials which are then put through between the rollers of the laminator.

The adhesive layer may be a temperature-sensitive adhesive (TSA) layer, a pressure-sensitive adhesive (PSA) layer or an adhesive that is curable by ultraviolet radiation (UVA), by exposure to an electron beam or which is thermally curable. Polymers in typical water-coatable TSA's are latices having a glass transition temperature (Tg) below 80° C. When the laminate of the present invention is to be used in a process requiring high temperatures, such as during the manufacturing of a flat panel display, suitable TSA's preferably contain polymers having a Tg that is at least 10° C. higher than the highest temperature of process. For similar reasons, a PSA or a curable adhesive is preferred which is thermally stable up to a temperature of 150° C. or even 200° C.

Preferred PSA layers for use in the present invention comprise one or more tacky elastomers, e.g. block copolymers of styrene/isoprene, styrene/butadiene rubbers, butyl rubbers, polymers of isobutylene and silicones. Particularly preferred are natural rubbers and acrylate copolymers as disclosed in U.S. Pat. No. 3,857,731. Said acrylate polymers preferably consist of 90 to 99.5% by weight of at least one alkyl acrylate ester and 10 to 0.5% by weight of a monomer selected from the group consisting of substantially oil-insoluble, water-soluble, ionic monomers and maleic anhydride. The acrylate ester portion preferably consists of those monomers that are hydrophobic, water emulsifiable, substantially water insoluble and which as homopolymers generally have a glass transition temperature of 20° C. or less. Examples of such monomers are iso-octyl acrylate, 4-methyl-2-pentyl acrylate, 2-methylbutyl acrylate and sec-butyl acrylate. Other examples of suitable monomers are e.g. trimethylamine methacrylamide, trimethylamine p-vinylbenzimide, ammonium acrylate, sodium acrylate, N,N-dimethyl-N-1-(2-hydroxypropyl)amine methacrylamide and maleic anhydride. The PSA preferably has a continuous-coat (100% coverage) peel adhesion value, when applied to untreated paper, between 0.1 and 10 N/cm width.

The PSA may further contain a binder. Suitable binders are inert towards the pressure-sensitive adhesives, i.e. they do not chemically attack the pressure-sensitive adhesives. Examples of such binders are nitrocellulose, urethanes, gelatine, polyvinyl alcohol, etc. The amount of binder should be chosen such that the pressure-sensitive adhesives laminate effectively. Preferably the amount of binder is lower than 2.5 parts by weight with respect to the pressure-sensitive adhesives and more preferably lower than 0.6 parts by weight.

UVA's can be broadly classified into two categories : free radical polymerised and cationic polymerised. Polymers formed by free radical polymerisation are generally based upon acrylic monomers or oligomers which are converted to high molecular weight polymers by crosslinking upon exposure to ultraviolet radiation. The UVA preferably contains a photo-initiator such as a benzophenone-amine, alpha-substituted acetophenone or amino-acetophenone. The addition of isopropyl thioxanthone is known to have a sensitising effect on the photo-initiator and to shift the useful exposure to near visible light, which is important for user safety. Other ingredients typically used in UVA's are flexibilisers such as thermoplastics solvated or dispersed in the acrylic material, adhesion promoters such as polyethylene or polypropylene, and fillers. Additional information on UVA's can be found in RadCureLetter No. 5 (1996) and Tappi Journal, January 1992, p. 121–125. Electron beam curable adhesives work in principle according to the same mechanism as UV-curable adhesive, however without requiring a photo-initiator.

Examples of suitable adhesives for use in the present invention are Solucryl (trade name by UCB, Belgium), preferably Solucryl types 355 HP, 380 and 825D; Rhodotak (trade name by Rhône-Poulenc); Acronal (trade name by BASF); Duro-Tak 380-2954 (trade name by National Starch & Chemical B.V.); PERMAprint type PP2011 and PERMAgard type PG7036 (trade names by Varitape N.V., Belgium).

The laminate of the present invention comprises at least one thin borosilicate glass substrate and at least one support as constituting layers. In a preferred method for making the laminate of the present invention, one or more functional layers are applied on an outer surface of one of the constituting layers of the laminate, preferably using a web coating apparatus. In an alternative method, the support may first be provided with one or more functional layers before being laminated to the thin borosilicate glass substrate. By laminating the coated side of the support to the glass substrate, a support/functional-layer/glass laminate is obtained (optionally including an adhesive layer between the functional layer and the glass). By laminating the opposite side to the glass substrate, a glass/support/functional-layer laminate is obtained. A disadvantage of said alternative method is that the lamination has to be carried out in darkroom conditions when the functional layer is light-sensitive, e.g. an image recording layer.

Specific embodiments of higher complexity may comprise a plurality of glass substrates and/or supports. According to the present invention, a laminate which comprises a thin borosilicate glass substrate and a support S1 may be laminated to another support S2 which has been provided with one or more functional layers, so as to obtain a laminate corresponding to one of the following embodiments (it shall be understood that these embodiments may optionally include an adhesive layer):

S1/glass/S2/functional-layer
glass/S1/S2/functional-layer
S1/glass/functional-layer/S2
glass/S1/functional-layer/S2

In both the latter embodiments, the support S2 may be a temporary support which can be delaminated from the functional layer. It is self-evident that, within the scope of the present invention, many combinations of the above embodiments can be made, e.g. a laminate which comprises one or more functional layer(s) on an outer surface as well as between the constituting layers of said laminate.

In a preferred embodiment, a functional layer is provided on the outer surface of the thin borosilicate glass substrate of the laminate. Before applying said functional layer, the surface of the borosilicate glass can be pre-treated, e.g. can be etched or pre-coated with a subbing layer for a good adherence to the functional layer. Particularly suitable subbing layers for said purpose are on the basis of silicon containing compounds, e.g. those described in U.S. Pat. No. 3,661,584 and GB 1,286,467. Said silicon containing compound is preferably an epoxysilane and may also be added to the coating composition of the functional layer. The laminate can also be coated with a silicate sol/gel coat having preferably a thickness of at least 1 $\mu$m, and more preferably a thickness of at least 10 $\mu$m. Such a silicate sol/gel coat is typically applied on sodium glass used in a flat panel display to prevent diffusion of sodium ions to the electroconductive layer applied on the glass. When alkaline-free borosilicate glass is used in the laminate of the present invention, such a silicate sol/gel coat is not necessary.

The functional layer can be applied on the support or on the laminate of the present invention by sputtering, by physical vapour deposition, by chemical vapour deposition, as well as by coating from a liquid coating solution such as spin coating, dip coating, rod coating, blade coating, air knife coating, gravure coating, reverse roll coating, extrusion coating, slide coating and curtain coating. An overview of these coating techniques can be found in "Modern Coating and Drying Technology", Edward Cohen and Edgar B. Gutoff Editors, VCH publishers, Inc, New York, N.Y., 1992. A plurality of layers may be coated simultaneously, e.g. by coating techniques such as slide coating or curtain coating. After coating the functional layer(s), the material can be kept on roll or cut in sheets.

A preferred example of a functional layer which may be coated on the support or on the laminate of the present invention, is an image recording layer such as a light-sensitive or heat-sensitive layer. The exposure and optional processing of the image recording layer can be done before or after lamination. The laminate of the present invention is especially suited for use in image recording materials which require high dimensional stability, e.g. for materials which are suitable for making photomasks in the preparation of printed circuit boards or integrated circuits by photolithography, for graphic arts image-setting film or for printing plates, such as lithographic pre-sensitised plates, monosheet diffusion transfer reversal (DTR) plates, driographic plates, thermal plates, etc. The light-sensitive compositions of pre-sensitised plates typically contain diazo compounds and can roughly be divided in negative-working types and positive-working types. The negative-working compositions comprise e.g. light-sensitive diazo compounds and preferably polymeric compounds. As the diazo compounds used in a positive-working composition, any compounds conventionally known may be utilised and typical examples thereof are o-quinonediazides and preferably o-naphthoquinonediazide compounds. These o-quinonediazide compounds may be used alone, but are preferably used as a mixture with an alkali-soluble resin to form a light-sensitive layer.

Typical examples of light-sensitive materials, which may comprise the laminate of the present invention, are silver halide photographic materials consisting of at least one aqueous hydrophilic layer containing silver halide crystals, e.g. black-and-white materials, colour materials, materials for use in medical diagnosis, motion picture materials, diffusion transfer reversal materials, etc. The composition of typical silver halide emulsion layers and auxiliary layers is described in e.g. Research Disclosure no. 17643 of December 1978 and Research Disclosure no. 307105 of November 1989. Specific examples of said auxiliary layers are protective layers, filter layers, barrier layers, mordanting layers, backing layers, anti-curl layers, anti-static layers, anti-halation layers, etc. Various embodiments of colour photographic materials are described in Research Disclosure no. 308119 of December 1989. For obtaining a flat panel display colour filter the laminate may be coated with at least three silver halide emulsion layers, each being sensitive to light of a different wavelength range. A more detailed description thereof is given in the Examples.

The laminate of the present invention may also carry so-called heat-mode or thermosensitive image recording layers because of the higher thermal stability compared to plastic supports consisting of organic polymers. Preferred thermosensitive layers require no wet processing so as to obtain dry imaging materials, e.g. DRAW materials (Direct Read After Write), heat-processable materials such as the so-called Dry Silver materials or materials for COM-production (Computer Output on Microfilm) as described in e.g. Journal of Applied Photographic Engineering, Vol. 9, No. 1, p. 12 (February 1983). A survey of metal layers suited for use as image recording layer in DRAW heat-mode recording is given in U.S. Pat. No. 4,499,178 and U.S. Pat. No. 4,388,400. For the production of optical discs wherein the information is read in reflection mode, a thermosensitive recording layer having low reflectivity may be applied on a relatively high-reflective layer such as an aluminium layer.

Thin metal layers are preferably applied by vacuum deposition techniques. In a preferred embodiment of a heat-mode recording material, a thin vacuum deposited layer of bismuth (Bi) is used as the heat-mode recording layer. Bi is characterised by a low toxicity and forms films with ease by vapour deposition under vacuum conditions. Said Bi film may be image-wise ablated or fused into small particles with a low amount of energy. More details of this material can be found in EP-B-384 041.

In a further embodiment, a heat-mode recording layer is obtained with binderless organic dye layers as described e.g. in the periodical Philips Techn. T. 41, p. 338–346 by D. J. Gravesteijn and J. van der Veen. In still another application the image recording layer is a photochromic layer as described in Chapter 8 of "Imaging Systems", K. I. Jacobson and R. E. Jacobson, Focal press (1976) p. 143 et seq. The image recording layer may also be a photodelamination layer as described in Research Disclosure no. 22202 (October 1982), p. 328–329. Several printing methods may also benefit from the use of a laminate according to the present invention, e.g. as an image receiving layer. Examples of such printing methods are electrophotographic (laser) printing, ink jet, toner jet, dye diffusion transfer, thermal wax printing, flexographic printing and screen printing.

The laminate of the present invention may also carry one or more non-imaging layers. Examples of such layers are adhesive layers, magnetic layers, hard-coat layers, pigment layers, thermo-adhesive layers, UV-absorbing layers, thermoplastic layers, etc. The laminate may also be coated with a phosphor layer so as to obtain a so-called X-ray intensifying screen used in medical diagnosis, thereby enabling a higher phosphor sintering temperature compared to conventional plastic supports.

Highly preferred functional layers which can be carried by the laminate, preferably by the glass side of the laminate, are the known liquid crystal orientation layers, electroconductive layers and colour-filter layers used in flat panel displays. A liquid crystal orientation layer consists typically of a polyimide film which is mechanically rubbed. Films consisting of tin oxide, indium oxide or tin-doped indium oxide (ITO) are widely used as electroconductive layers in flat panel displays because these materials possess high transparency in the visible spectrum combined with a fairly low electrical resistivity. ITO can be coated by e.g. RF-sputtering from an ITO target, described by J. L. Vossen in Physics of thin films, pp. 1–71, Academic Press, New York (Plenum Press, 1977) or reactive DC magnetron sputtering from an indium-tin target, described in Thin Solid Films, Vol.83, pp.259–260 (1981) and Vol.72, pp.469–474 (1980), followed by thermal treatment. Suitable colour-filter layers for use in flat panel displays are disclosed in e.g. EP-B 396 824 and EP-A 615 161.

The laminate of the present invention may also comprise a non-continuous functional layer, e.g. an image or electronic components such as the electroconductive rows and columns in passive-matrix displays or the thin-film-transistors (TFTs) and pixel electrodes used in active-matrix displays. For the application of such electronic components on regular sheet glass, screen printing is typically used, but the flexible laminate of the present invention also enables the use of faster and more reliable patterning techniques such as offset printing. The discontinuous layer can also be formed on the laminate of the present invention by photolithography, lamination followed by delamination, ink jet, toner jet, electrophotography, or thermosublimation.

The laminate of the present invention is an excellent substrate for use in the manufacturing process of passive-matrix liquid crystal displays, especially in supertwisted nematic (STN), double supertwisted nematic (DSTN), retardation film supertwisted nematic (RFSTN), in ferroelectric (FLC), guest-host (GH), polymer-dispersed (PF), polymer network (PN) liquid crystal displays, and so on. Also active-matrix LCDs such as thin-film-transistor (TFT) displays may benefit from the use of the laminate of the present invention as substrate.

Emissive display technologies which may benefit from the present invention are e.g. electroluminescent displays, plasma displays, field emission displays (FEDs) and so-called light-emitting polymer displays (LEPs). LEPs are polymers which glow when exposed to an electric current and are disclosed in e.g. U.S. Pat. No. 5,247,190 and U.S. Pat. No. 5,401,827.

The laminate of the present invention also allows to obtain improved flexible displays. The flexible displays known today are LCDs wherein plastic sheets are used as support for carrying the functional layers. However, the liquid crystal composition and other functional layers between said plastic sheets are not well protected from oxygen, moisture and other external influences and, as a result, the lifetime of such flexible displays is limited. Since the glass substrate of the laminate according to the present invention is an excellent barrier layer, a solution is also provided for said lifetime problem.

The low weight of the laminate makes it very suitable for incorporation in mobile devices such as portable computers, photo and video cameras, calculators, car dashboards, etc. Since weight reduction is also a major problem in the manufacturing of satellites, the use of the laminate of the present invention for making solar cells also provides interesting advantages.

EXAMPLES

Example 1

Samples were prepared according to the indications in Table 2. All these laminates were vacuum laminates. The length of each sample was measured at 30% (L30) and 60% (L60) relative humidity (R.H.), both at 21.5° C., and the percentual dimensional change per % R.H. was calculated as follows: (L60-L30)*100/(30*L30). The results in Table 2 indicate that lamination of a polyester (PET) foil with a thin borosilicate glass significantly improves the dimensional stability.

TABLE 2

| Constituting layers (thickness in μm) "glass" = borosilicate AF45 (a) | Dimensional change (μm/m/% R.H.) |
|---|---|
| glass (70) | 0 |
| PET (100) | 13 |
| glass (70)/PET (100) | 3 |
| PET (100)/glass (70)/PET (100) | 7 |
| PET (20)/glass (70)/PET (100) | 3 |

(a) available from Deutsche Spezialglass AG (Desag, Germany), a Schott group company.

Example 2

A borosilicate glass sheet of size 300×200×0.1 mm type AF45 was coated with a subbing layer so that the dried layer comprised 1.50 g/m² of gelatine, 0.1 g/m² of ortho-cresol and 0.4 g/m² of the epoxysilane E defined below. The opposite side of said glass sheet was laminated to a polyester foil which was coated on one side with a polyethylene layer, said polyethylene layer acting as an adhesive layer. The polyester foil had a thickness of 170 μm, a width of 23 cm and a length of 5.6 m, the latter corresponding to the web length of the laboratory cascade-coater used in this experiment. In said coater the web forms an endless loop which travels along a triangular path defined by 3 rollers of which the smallest has a radius of 5 cm. As a comparative example, a similar glass sheet was fixed to another area of said polyester foil with regular self-adhesive tape on the leading and trailing edge of the glass sheet. The foil was then mounted in said laboratory web-coater and a gelatine layer was applied on the glass side of the foil by coating a 5 wt. % aqueous gelatine solution held at 38° C. and containing a surfactant as a spreading agent. This experiment was repeated 20 times. In 8 of said 20 coating experiments, the taped glass sheet broke during coating whereas none of the laminated glass sheets broke, indicating the significant increase of the strength of the glass due to lamination.

Example 3

A colour photographic material was prepared by coating on a PET film of thickness 100 μm an anti-halation layer, a blue sensitive layer, a first intermediate layer, a green sensitive layer, a second intermediate layer and a red sensitive layer. The composition of said layers was disclosed in EP-A 802 453, which is reproduced hereinafter, the definition of the compounds being given below:

Anti-halation layer

A non-diffusing yellow dye of formula YD, was dispersed in gelatine. To this dispersion epoxysilane E acting as an adhesion promotor was added. The coverage of yellow dye YD, gelatine and epoxysilane E was 0.5, 1.5 and 0.1 g/m² respectively.

Blue sensitive layer

A 100 % silver chloride emulsion with an average grain size of 0.4 μm was sensitised to blue light with a spectral sensitising agent of formula SB. A yellow dye forming coupler of formula Y1 was added to this emulsion. The amounts of silver halide, gelatine and colour coupler Y1 were 0.57, 3.30 and 1.0 g/m² respectively.

First intermediate layer

A substance of formula SD1, capable of scavenging oxidised colour developing agent was dispersed in gelatine and coated at a coverage of 0.08 g/m² of SD1 and of 0.77 g/m² of gelatine.

Green sensitive layer

A silver chloride-bromide (90/10 molar ratio) emulsion with an average grain size of 0.12 μm was sensitised to green light with a spectral sensitising agent of formula SG. A magenta dye forming coupler of formula M1 was added to this emulsion. The amounts of silver halide, gelatine and colour coupler M1 were 0.71, 2.8 and 0.53 g/m² respectively.

Second intermediate layer

This layer had the same composition as the first intermediate layer.

Red sensitive layer

A silver chloride-bromide (90/10 molar ratio) emulsion with an average grain size of 0.12 μm was sensitised to red light with a spectral sensitising agent of formula SR. A cyan dye forming coupler of formula C1 was added to this emulsion. The amounts of silver halide, gelatine and colour coupler C1 were 0.49, 6 and 0.95 g/m² respectively.

Yellow, magenta and cyan water-soluble dyes, acting as accutance dyes were present at an appropriate coverage in the blue, green en red sensitive layer respectively and hydroxy-trichloro-triazine acting as hardening agent was present in the red sensitive layer at a coverage of 0.035 g/m².

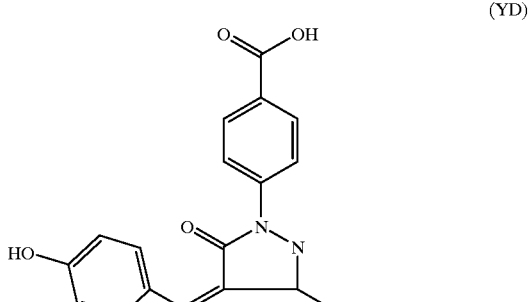
(YD)

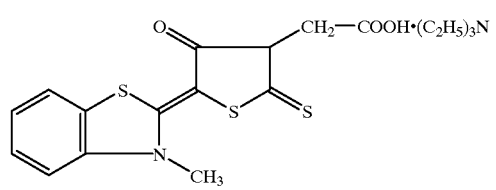
(SB)

-continued (Y1)
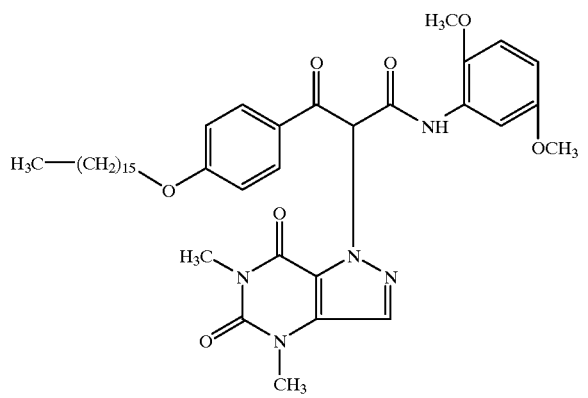

(C1)
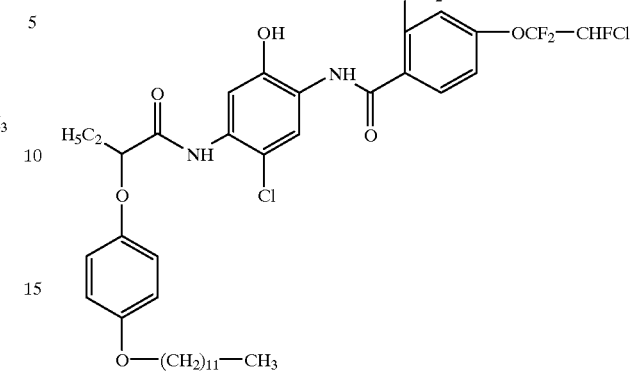

(SD1)
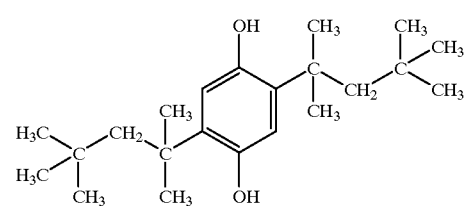

(E)
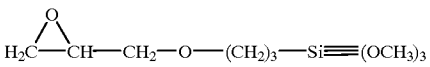

The back side of this material was then laminated to a flexible borosilicate glass sheet of type AF45 having a thickness of 100 μm, so as to obtain a laminate according to the present invention carrying a colour image recording layer on the PET side of the laminate. Solucryl (trade name by UCB, Belgium), type 355 HP was used as an adhesive between the glass and the PET layer. The laminate was then exposed using a single-step pixel-wise exposure using a multi-colour master and processed according to the following procedure:

Developer (SG)
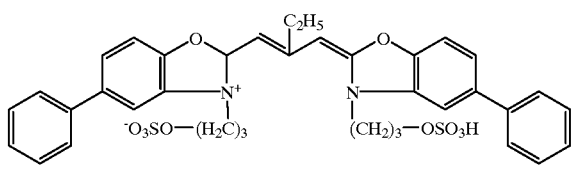

| | |
|---|---|
| Sodium sulphite (anhydrous) | 4 g |
| 4-amino-3-methyl-N,N-diethylaniline hydrochloride | 3 g |
| sodium carbonate (anhydrous) | 17 g |
| sodium bromide | 1.7 g |
| sulphuric acid 7N | 0.62 ml |
| water up to | 1000 ml |

(M1)
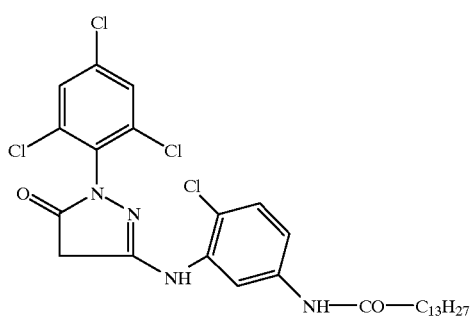

After development the material was treated in an acid stop bath prepared by adding water up to 1 l to 50 ml of sulphuric acid 7 N.

The treatment with stop bath was followed by 2 minutes rinsing in plain water followed by a 2 minutes fixing in an aqueous solution having the following composition:

| | |
|---|---|
| 58% aqueous solution of $(NH_4)_2S_2O_3$ | 100 ml |
| sodium sulphite (anhydrous) | 2.5 g |
| sodium hydrogen sulphite (anhydrous) | 10.3 g |
| water up to | 1000 ml |

(SR)
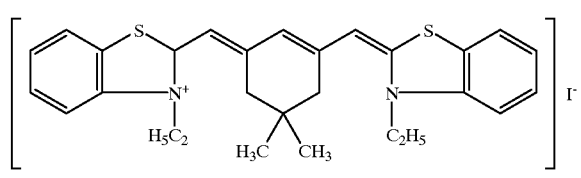

The treatment with fixing liquid was followed by a 2 minutes rinsing in plain water followed by a 3 minutes bleaching in an aqueous solution having the following composition:

| | |
|---|---|
| potassium hexacyanoferrate (III) (anhydrous) | 30 g |
| sodium bromide (anhydrous) | 17 g |
| water up to | 1000 ml |

Then the material was treated with the fixing liquid again and rinsed for 3 minutes with plain water.

Finally the material was treated with an aqueous solution having a pH of 9 and containing per liter 20 ml of a 40% aqueous solution of formaldehyde serving as hardening agent.

After the above processing, a multi-colour filter suitable for LCDs was obtained, said filter consisting of a yellow image, a magenta image and a cyan image each at maximum density. Compared to the prior art, as described in e.g. EP-A 802 453 wherein a coating of the same composition as above on a glass sheet having a thickness of 1.5 mm is described, the multi-colour filter of the present example is characterised by a much lower weight.

What is claimed is:

1. A flexible laminate comprising a glass substrate and a support, said glass substrate being a borosilicate glass having a thickness in the range from 10 to 450 µm.

2. The flexible laminate according to claim 1 wherein said glass substrate has a thickness in the range from 30 to 300 µm.

3. The flexible laminate according to claim 1 wherein said glass substrate has a thickness in the range from 50 to 200 µm.

4. The flexible laminate according to claim 1 wherein an intermediate adhesive layer is present between said glass substrate and said support.

5. The flexible laminate according to claim 1 wherein said support is a transparent plastic support.

6. The flexible laminate according to claim 5 wherein said transparent plastic is poly(ethylene terephthalate), polycarbonate, polyether-sulfone or polydicyclopentadiene.

7. The flexible laminate according to claim 1 further comprising a functional layer.

8. The flexible laminate according to claim 7 wherein said functional layer is applied on the glass.

9. The flexible laminate according to claim 7 wherein said functional layer is applied on the support.

10. The flexible laminate according to claim 7 wherein said functional layer is an image recording layer.

11. The flexible laminate according to claim 7 wherein said functional layer is a color filter.

12. The flexible laminate according to claim 7 wherein said functional layer is an electroconductive layer.

13. The flexible laminate according to claim 12 wherein said electroconductive layer consists essentially of indium-tin oxide.

14. The flexible laminate according to claim 7 wherein said functional layer is a non-continuous layer.

15. The flexible laminate according to claim 7 wherein said functional layer is applied by using a printing method.

16. The flexible laminate according to claim 1, wherein said flexible laminate is capable of being wound around a cylindrical core having a radius of 1.5 m without breaking.

17. A method of producing a flexible laminate comprising steps of making a coated support by applying a functional layer on a support;

laminating the coated support to a borosilicate glass having a thickness in the range from 10 to 450 µm.

18. A method of producing a flexible laminate comprising steps of making a coated support by applying a functional layer on a support;

laminating the coated support to a laminate comprising a glass substrate and a support, said glass substrate being a borosilicate glass having a thickness in the range from 10 to 450 µm.

19. A process of manufacturing a flat panel display comprising providing a flexible laminate which comprises a glass substrate and a support, said glass substrate being a borosilicate glass having a thickness in a range from 10 to 450 µm; and making a flat panel display with said flexible laminate.

20. A process of coating a web material comprising applying a functional layer on a flexible laminate, wherein said flexible laminate comprises a glass substrate and a support, said glass substrate being a borosilicate glass having a thickness in a range from 10 to 450 µm.

* * * * *